(12) United States Patent
Furukawa et al.

(10) Patent No.: US 6,228,705 B1
(45) Date of Patent: May 8, 2001

(54) OVERLAY PROCESS FOR FABRICATING A SEMICONDUCTOR DEVICE

(75) Inventors: Toshiharu Furukawa, Essex Junction; Mark C. Hakey; Steven J. Holmes, both of Milton; David Horak, Essex Junction, all of VT (US); William H. Ma, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/243,221

(22) Filed: Feb. 3, 1999

(51) Int. Cl.$^7$ ................................................. H01L 21/8242
(52) U.S. Cl. ........................................... 438/243; 438/386
(58) Field of Search ..................................... 438/243, 386, 438/389, 390, 244, 246, 247, 301, 706, 391, 714

(56) References Cited

U.S. PATENT DOCUMENTS

| | | |
|---|---|---|
| 4,345,836 | 8/1982 | Phillips . |
| 4,529,314 | 7/1985 | Ports . |
| 4,669,866 | 6/1987 | Phillips . |
| 5,360,758 * | 11/1994 | Bronner et al. ............... 438/386 |
| 5,369,049 | 11/1994 | Acocella et al. . |
| 5,389,559 * | 2/1995 | Hsieh et al. ................... 438/243 |
| 5,498,500 * | 3/1996 | Bae ................................. 430/22 |
| 5,677,091 | 10/1997 | Barr et al. . |
| 5,741,625 | 4/1998 | Bae et al. . |
| 6,074,909 * | 6/2000 | Gruening ........................ 438/242 |

* cited by examiner

Primary Examiner—David Nelms
Assistant Examiner—David Nhu
(74) Attorney, Agent, or Firm—Ratner & Prestia; William D. Sabo, Esq.

(57) ABSTRACT

A process for fabricating a semiconductor device. In an exemplary embodiment, the process includes the following steps. The process initially defines a first registration mark associated with a first mask level of the semiconductor device and a second registration mark associated with a second mask level of the semiconductor device. The process then defines a third registration mark associated with a third mask level of the semiconductor device based on the first and second registration marks. Finally, the process aligns the third mask level along a first axis with respect to the first registration mark, and aligns the third mask level along a second axis with respect to the second registration mark. According to various aspects of the invention, the semiconductor fabrication process is used to fabricate DRAM trench cells, or any other type of semiconductor device whose fabrication requires tight overlay alignment between the various levels of the device.

8 Claims, 2 Drawing Sheets

OVERLAY PROCESS FOR FABRICATING A SEMICONDUCTOR DEVICE

TECHNICAL FIELD

The present invention relates generally to semiconductor devices and, more particularly, to a process for fabricating such devices that tightly controls overlay among the masks used in conjunction with photolithographic equipment.

BACKGROUND OF THE INVENTION

Semiconductor devices are typically constructed with a plurality of layers or levels, each of which are selectively deposited and etched to fabricate the device. The etching processes are typically controlled with masks used in conjunction with photolithographic equipment. Each layer is formed by an individual deposition and etching process, and the device is fabricated by building successive layers of the device from the bottom up. The etching process corresponding to each layer is governed by a separate mask, which controls how that layer is etched and formed. For the finished device to work properly, and to maximize the efficiency of the fabrication process, the masks that govern the formation of the various layers must be aligned precisely so that the various layers of the device align, or register, properly.

In conventional processes for fabricating a semiconductor device, a given layer of the device is aligned with only the immediately previous layer of the device. The given layer is not aligned with the layer under the immediately previous layer (a "second-previous" layer). Typically, this alignment approach results both in first-order alignment error between the given layer and the previous layer and in second-order alignment error between the given layer and the second-previous layer. Accordingly, as the various layers are fabricated to form the device, these second-order alignment errors between layers can accumulate, causing the overlay among the various layers to deteriorate and leading to overall process inefficiency and possible device failure. The accumulated alignment error can be reduced, however, if the alignment error between the given layer and the second-previous layer is reduced to first-order. Conventional fabrication processes do not provide first-order alignment error between the given layer and both of the two previous layers.

As the size of semiconductor devices continues to decrease, the registration between the various layers of those devices becomes more critical. Accordingly, there exists a need in the art for fabrication processes that provide the tightest possible registration between those various layers, preferably with first-order alignment error between a given layer and both of the two previous layers.

SUMMARY OF THE INVENTION

To meet this and other needs, and in view of its purposes, the present invention provides a process for fabricating a semiconductor device comprising the following steps. In an exemplary embodiment of the invention, the process defines a first registration mark associated with a first mask level of the semiconductor device, and defines a second registration mark associated with a second mask level of the semiconductor device. The process then aligns a third mask level of the semiconductor device based on the first and second registration marks. Specifically, the process aligns the third mask level along a first axis with respect to the first registration mark, and aligns the third mask level along a second axis with respect to the second registration mark.

According to various aspects of the invention, the semiconductor fabrication process is used to fabricate dynamic random access memory (DRAM) trench cells, or any other type of semiconductor device whose fabrication requires tight overlay alignment between the various levels of the device. The process of the invention is generally applicable to any semiconductor fabrication process that requires alignment of a third mask at an intersection point of two alignment marks associated with two previous levels.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

The invention provides a process for fabricating a semiconductor device. In an exemplary, but not limiting embodiment, the process is used to fabricate a semiconductor device such as a dynamic random access memory (DRAM) trench cell. The fabrication rules applicable to certain semiconductor devices, for example the DRAM trench cell, require a tight overlay between the buried strap level and a point centered over the intersection point of the center of the collar and the isolation trench. This requirement implies a tight vertical overlay with respect to the deep trench layer and a tight horizontal overlay with respect to the isolation trench layer.

For example, a MINT (merged-isolation and node-in-trench) cell, which is a specific type of DRAM, has many unique features. The size of a MINT trench cell is significantly driven by critical level overlay, and its use is hampered somewhat by its major dependence on tight lithographic overlay requirements. The tighter the overlay, the smaller the cell size, and the higher the yield from the fabrication process. As understood in the art, the cell size and the yield are traded-off one against the other. The process of the present invention tightens the overlay, enabling the process designer to optimize the cell size, the process yield, or the balance desired.

With conventional processes, the buried strap level of the cell is aligned to only one of either the deep trench level or the isolation trench level. This scheme suffers a disadvantage in that the alignment between the buried strap level and either the deep trench level or the isolation trench level will be second order, rather than first order. Such second-order overlay alignment increases the area of the cell. In contrast, the present invention provides a process for realizing first-order overlay alignment between the buried strap level and both the deep trench level and the isolation trench level.

Figure 1:
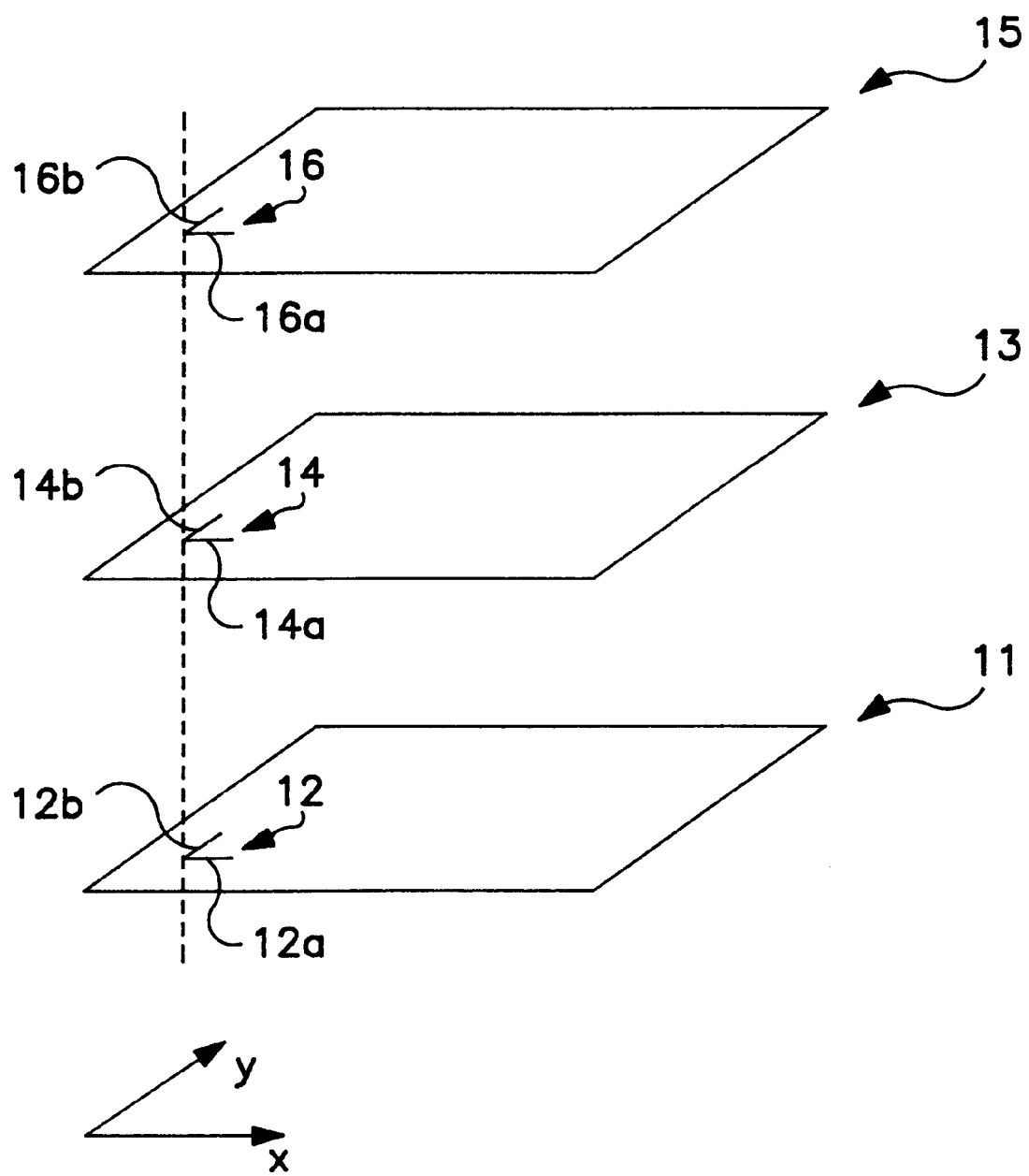
FIG. 1 is a diagram illustrating in conceptual form an exemplary process according to the present invention.

In an exemplary embodiment, the process of the invention meets these overlay requirements by using the steps described below to fabricate a semiconductor device, such as a DRAM trench cell. FIG. 1 is a diagram illustrating in conceptual form an exemplary process of the invention. FIG. 1 also shows an x-y coordinate system as a frame of reference for the discussion below.

The process defines and associates a first registration mark 12 with a first mask level 11 of the semiconductor device. In an exemplary embodiment of the invention, the first registration mark 12 is associated with a first mask level 11 corresponding to a deep trench layer of a trench cell. First registration mark 12 includes horizontal component 12a and vertical component 12b, which correspond to the x and y axes of the x-y coordinate system shown in FIG. 1. The first level of the device is then etched, and the first registration mark 12 is printed, for example on the device substrate, for future reference.

The process then defines and associates a second registration mark 14 with a second mask level 13 of the semiconductor device. In an exemplary embodiment of the invention, the second registration mark 14 is associated with a second mask level 13 corresponding to an isolation trench layer of the trench cell. The second registration mark 14 includes horizontal component 14a and vertical component 14b, which correspond to the x and y axes of the x-y coordinate system shown in FIG. 1. The second level of the device is then etched, and the second registration mark 14 is printed, for example on the device substrate, for future reference.

Figure 2:
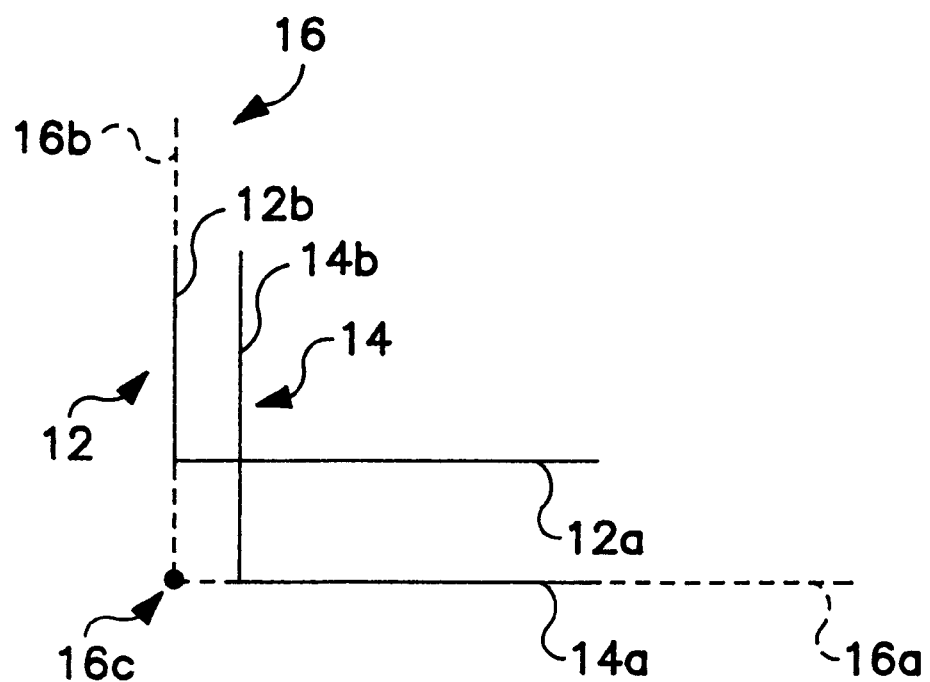
FIG. 2 is a diagram illustrating the relationships between the various alignment marks used in the process of the present invention.

Given the two registration marks 12 and 14, the process defines a third "hybrid" registration mark 16 corresponding to a third mask level 15 by selecting intersecting components from the two registration marks 12 and 14. A registration point on the third mask level 15 is aligned with the intersection point 16c, as shown in FIG. 2 and discussed in further detail below. In an exemplary embodiment of the invention, the third registration mark 16 is associated with a third mask level 15 of the trench cell corresponding to a buried strap layer.

FIG. 2 is a diagram illustrating the derivation of the third registration mark 16 from the components of the first registration mark 12 and the second registration mark 14. The third registration mark 16 includes a horizontal component 16a and a vertical component 16b, which for convenience can be taken to correspond to the x and y axes of the x-y coordinate system shown in FIG. 1. The horizontal component 16a of the third registration mark 16 coincides with the horizontal component 14a of the second registration mark 14, and the vertical component 16b coincides with the vertical component 12b of the first registration mark 12. In this manner, the third registration mark 16 corresponding to the third mask level 15 is defined from components of the registration marks 12 and 14 corresponding to two previous levels. Also, the third mask level 15 is aligned to both of the previous two levels 11 and 13 by registering it to the hybrid third registration mark 16.

The third mask level 15 is aligned along a first axis with respect to the first registration mark 12, and along a second axis with respect to the second registration mark 14. In an exemplary embodiment of the invention, the third mask level 15 is aligned along a vertical axis (the y-axis) and aligned with respect to the first registration mark 12. In addition, the third mask level 15 is aligned along a horizontal axis (the x-axis) and aligned with respect to the second registration mark 14.

As noted above, in an exemplary embodiment, the first registration mark 12 is associated with the first mask level 11 corresponding to the deep trench layer. The second registration mark 14 is associated with the second mask level 13 corresponding to the isolation trench layer. Finally, the third registration mark 16 is associated with the third mark level 15 corresponding to the buried strap layer. In this manner, the buried strap layer is aligned along a vertical axis (the y-axis) with respect to the deep trench layer, and is aligned along a horizontal axis (the x-axis) with respect to the isolation trench layer.

As described above, the third registration mark 16 can be thought of as a "hybrid" registration mark. In an exemplary embodiment, the third registration mark 16 is defined with a vertical component 16b derived from the vertical component 12b of the first registration mark 12 corresponding to the deep trench level. The third registration mark 16 also has a horizontal component 16a derived from the horizontal component 14a of the second registration mark 14 corresponding to the isolation trench level. It should be understood that the third registration mark 16 could be defined with the vertical component 16b derived from the vertical component 14b and the horizontal component 16a derived from the horizontal component 12a.

Using a step-and-repeat tool with orthogonal X and Y marks, the vertical component 16b of the third registration mark 16 could be aligned with the deep trench mask 11, and the horizontal component 16a of the third registration mark 16 could be aligned with the isolation trench mask 13. In this manner, the buried strap mask level 15 is aligned along a vertical axis (the y-axis) and with respect to the deep trench mask level 11 to optimize the vertical registration between the buried strap mask level 15 and the deep trench mask level 11. In addition, the buried strap mask level 15 is aligned along a horizontal axis (the x-axis) and with respect to the isolation trench mask level 13 to optimize the horizontal registration between the buried strap mask level 15 and the isolation trench mask level 13.

The alignment process described above offers significant advantages over conventional alignment processes. Specifically, the buried strap layer 15 is aligned not only with the isolation trench layer 13, but also with the deep trench layer 11. The advantages of the process of the invention are clear when compared to the conventional approach. In the conventional approach, a third layer of the semiconductor device is aligned only with a second layer, which is below the third layer. If the second layer is not properly registered with a first layer below the second layer, then the third layer is similarly not properly registered with the first layer. Typically, using this conventional approach, the overlay between the first and the third layer is second order, which will grow the size of the cell unnecessarily.

Any lack of proper registration between the third and first layers can contribute to a larger cell area or can reduce the overall yield of the cell fabrication process depending on the trade-off chosen by the process designer. Using the exemplary process of the invention, however, the third layer is aligned not only with the second layer, but also with the first layer. The process of the invention tightens the registration between the third, second, and first layers--not just the registration between the third and the second layers. Accordingly, the process of the invention enables the process designer to optimize the process to achieve a smaller cell area or increase the overall yield of the cell fabrication process. Using the process of the invention, the overlay between the third and both the first and second layers is first order, which can reduce the area of the cell by approximately 10%. With first-order overlay between the third layer and both the second and first layers, the process designer is free to optimize the fabrication process in favor of cell size or process window.

Although illustrated and described above with reference to certain specific embodiments, the present invention is nevertheless not intended to be limited to the details shown. Rather, various modifications may be made in the details of the invention within the scope and range of equivalents of the claims and without departing from the invention.

For example, the above discussion of an exemplary process of the invention described the process in the context of the fabrication of a MINT trench cell. It should be understood that the process of the invention is not limited to this type of trench cell, however, and can be used to fabricate other types of trench cells. Also, the process of the invention can be extended to the fabrication of other semiconductor devices, especially those devices having layers that must be aligned to intersection points of previous levels. It should also be understood that the labels "first," "second," and "third" are not used to describe the mask levels; rather, the labels are used in a relative sense, not an absolute sense. Thus, the "first" layer does not necessarily refer to the layer immediately proximate the device substrate, but instead may designate any layer included within the device.

What is claimed:

1. A process for fabricating a semiconductor device, the process comprising the steps of:
    defining a first registration mark associated with a first mask level of the semiconductor device;
    defining a second registration mark associated with a second mask level of the semiconductor device;
    defining a third registration mark associated with a third mask level of the semiconductor device based on the first and second registration marks;
    aligning the third mask level along a first axis with respect to the first registration mark; and
    aligning the third mask level along a second axis with respect to the second registration mark.

2. The process of claim 1, wherein the step of defining a first registration mark includes associating the first registration mark with a deep trench mask level of the semiconductor device.

3. The process of claim 1, wherein the step of defining a second registration mark includes associating the second registration mark with an isolation trench mask level of the semiconductor device.

4. The process of claim 1, wherein the step of defining a third registration mark includes associating the third registration mark with a buried strap mask level of the semiconductor device.

5. The process of claim 1, wherein the step of aligning the third mask level along a first axis includes aligning the third mask level along a vertical axis and aligning with respect to the first registration mark.

6. The process of claim 1, wherein the step of aligning the third mask level along a second axis includes aligning the third mask level along a horizontal axis and aligning with respect to the second registration mark.

7. A process for fabricating a dynamic random access memory (DRAM) deep trench cell comprising the steps of:
    defining a first registration mark associated with a deep trench mask level of the trench cell;
    defining a second registration mark associated with an isolation trench mask level of the trench cell;
    defining a third registration mark associated with a buried strap mask level of the trench cell;
    aligning the buried strap mask level along a vertical axis and with respect to the deep trench mask level to optimize a vertical registration between the buried strap mask level and the deep trench mask level; and
    aligning the buried strap mask level along a horizontal axis with respect to the isolation trench mask level to optimize a horizontal registration between the buried strap mask level and the isolation trench mask level.

8. The process of claim 7, wherein the step of defining a third registration mark includes defining a third registration mark having a vertical component derived from the deep trench mask level and having a horizontal component derived from the isolation trench mask level.

* * * * *